(12) United States Patent
Lin et al.

(10) Patent No.: US 9,530,509 B2
(45) Date of Patent: Dec. 27, 2016

(54) DATA PROGRAMMING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Tien-Ching Wang, Kaohsiung (TW); Kuo-Hsin Lai, Hsinchu County (TW); Yu-Cheng Hsu, Yilan County (TW); Chi-Heng Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 83 days.

(21) Appl. No.: 14/727,878

(22) Filed: Jun. 2, 2015

(65) Prior Publication Data

US 2016/0284414 A1 Sep. 29, 2016

(30) Foreign Application Priority Data

Mar. 23, 2015 (TW) .............................. 104109209 A

(51) Int. Cl.

| | |
|---|---|
| *G06F 12/00* | (2006.01) |
| *G11C 16/14* | (2006.01) |
| *G06F 3/06* | (2006.01) |
| *G06F 12/08* | (2016.01) |
| *G11C 16/26* | (2006.01) |
| *G11C 29/44* | (2006.01) |

(52) U.S. Cl.
CPC ............. *G11C 16/14* (2013.01); *G06F 3/0604* (2013.01); *G06F 3/0619* (2013.01); *G06F 3/0629* (2013.01); *G06F 3/0679* (2013.01); *G06F 12/0802* (2013.01); *G11C 16/26* (2013.01); *G11C 29/4401* (2013.01); *G06F 2212/7203* (2013.01)

(58) Field of Classification Search
CPC ..... G11C 16/14; G11C 16/26; G11C 29/4401; G06F 3/0604; G06F 3/0619; G06F 3/0629; G06F 3/0679; G06F 12/0802; G06F 2212/7203
See application file for complete search history.

(56) References Cited

U.S. PATENT DOCUMENTS 7,916,547 B2 * 3/2011 Hosono ............... G11C 11/5642
365/185.02
8,902,671 B2 * 12/2014 Ko ........................ G11C 16/10
365/185.29

OTHER PUBLICATIONS

"Office Action of Taiwan Counterpart Application", issued on Apr. 25, 2016, p. 1-p. 11, in which the listed references were cited.

* cited by examiner

*Primary Examiner* — Shawn X Gu
(74) *Attorney, Agent, or Firm* — Jianq Chyun IP Office

(57) ABSTRACT

A data programming method, a memory storage device and a memory control circuit unit are provided. The method includes: receiving first data and programming the first data into a first lower physical programming unit; receiving second data; in response to the second data to be programmed into a first upper physical programming unit corresponding to the first lower physical programming unit, performing a first data obtaining operation which does not include reading the first lower physical programming unit by using a default read voltage; and programming the second data into the first upper physical programming unit according to the third data obtained through the first data obtaining operation.

27 Claims, 14 Drawing Sheets

|  | Lower physical programming unit | Upper physical programming unit |  |
|---|---|---|---|
| 901A | 0 | 2 | 911B |
| 902A | 1 | 4 | 912B |
| 903A | 3 | 6 | 913B |
| 904A | 5 |  | 914B |
|  | ⋮ | ⋮ |  |

|  | Lower physical programming unit | Upper physical programming unit |  |
|---|---|---|---|
| 901A | DATA-a | DATA-c | 911B |
| 902A | DATA-b | DATA-e | 912B |
| 903A | DATA-d |  | 913B |
|  | ⋮ | ⋮ |  |

DATA PROGRAMMING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 104109209, filed on Mar. 23, 2015. The entirety of the above-mentioned patent application is hereby incorporated by reference herein and made a part of this specification.

BACKGROUND

1. Technology Field

The present disclosure is directed to a memory management method and more particularly, to a data programming method, a memory storage device and a memory control circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the aforementioned portable multi-media devices.

Generally, if a certain memory cell in a memory module can store more than two bits, a programming operation of the memory cell may be performed in multiple times. A result of each programming operation may affect accuracy of each subsequently performed programming operation. Thus, how to improve the accuracy of the data that is finally programmed into the memory cells has become one of the subjects concerned by the technicians in the art.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a data programming method, a memory storage device and a memory control circuit unit capable of reducing a probability of errors occurring in a final programming result due to mistakenly determining a storage state of memory cells during a programming process.

According to an exemplary embodiment of the disclosure, a data programming method for a rewritable non-volatile memory module is provided. The rewritable non-volatile memory module includes a plurality of physical erasing units, and a first physical erasing unit among the physical erasing units includes a plurality of lower physical programming units and a plurality of upper physical programming units corresponding to the lower physical programming units. The data programming method includes: receiving first data and programming the first data into a first lower physical programming unit among the lower physical programming units; receiving second data; performing a first data obtaining operation corresponding to the first lower physical programming unit to obtain third data, wherein the first data obtaining operation includes reading the first lower physical programming unit by using a second read voltage, wherein a voltage value of the second read voltage is different from a default voltage value of a default read voltage corresponding to the first lower physical programming unit; and programming the second data into a first upper physical programming unit among the upper physical programming units according to the third data.

According to another exemplary embodiment of the disclosure, a memory storage device including a connection interface unit, a rewritable non-volatile memory module and a memory control circuit unit is provided. The connection interface unit is configured to couple to a host system. The rewritable non-volatile memory module includes a plurality of physical erasing units, and a first physical erasing unit among the physical erasing units includes a plurality of lower physical programming units and a plurality of upper physical programming units corresponding to the lower physical programming units. The memory control circuit unit is coupled to the connection interface unit and the rewritable non-volatile memory module. The memory control circuit unit is configured to receive first data and transmit a first write command sequence to program the first data into a first lower physical programming unit among the lower physical programming units. The memory control circuit unit is further configured to receive second data. The memory control circuit unit is further configured to instruct to perform a first data obtaining operation corresponding to the first lower physical programming unit to obtain third data, wherein the first data obtaining operation includes reading the first lower physical programming unit by using a second read voltage, wherein a voltage value of the second read voltage is different from a default voltage value of a default read voltage corresponding to the first lower physical programming unit. The memory control circuit unit is further configured to transmit a second write command sequence to program the second data into a first upper physical programming unit among the upper physical programming units according to the third data.

According to another exemplary embodiment of the disclosure, a memory control circuit unit for controlling a rewritable non-volatile memory module is provided. The rewritable non-volatile memory module includes a plurality of physical erasing units, and a first physical erasing unit among the physical erasing units includes a plurality of lower physical programming units and a plurality of upper physical programming units corresponding to the lower physical programming units. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to receive first data and transmit a first write command sequence to program the first data into a first lower physical programming unit among the lower physical programming units. The memory management circuit is further configured to receive second data. The memory management circuit is further configured to instruct to perform a first data obtaining operation corresponding to the first lower physical programming unit to obtain third data, wherein the first data obtaining operation includes reading the first lower physical programming unit by using a second read voltage, wherein a voltage value of the second read voltage is different from a default voltage value of a default read voltage corresponding to the first lower physical programming unit. The memory management circuit is further configured to transmit a second write command sequence to program the second data into a first upper physical programming unit among the upper physical programming units according to the third data.

According to another exemplary embodiment of the disclosure, a data programming method for a rewritable non-volatile memory module is provided. The rewritable non-volatile memory module includes a plurality of physical erasing units, and a first physical erasing unit among the physical erasing units includes a plurality of lower physical programming units and a plurality of upper physical programming units corresponding to the lower physical programming units. The data programming method includes: receiving first data and programming the first data into a first lower physical programming unit among the lower physical programming units; temporarily storing the first data in a buffer area of the rewritable non-volatile memory module; receiving second data; performing a first data obtaining operation corresponding to the first lower physical programming unit to obtain third data, wherein the first data obtaining operation includes reading the first data from the buffer area; and programming the second data into a first upper physical programming unit among the upper physical programming units according to the third data.

According to another exemplary embodiment of the disclosure, a memory storage device including a connection interface unit, a rewritable non-volatile memory module and a memory control circuit unit is provided. The connection interface unit is configured to couple to a host system. The rewritable non-volatile memory module includes a plurality of physical erasing units, and a first physical erasing unit among the physical erasing units includes a plurality of lower physical programming units and a plurality of upper physical programming units corresponding to the lower physical programming units. The memory control circuit unit is coupled to the connection interface unit and the rewritable non-volatile memory module. The memory control circuit unit is configured to receive first data and transmit a first write command sequence to program the first data into a first lower physical programming unit among the lower physical programming units. The memory control circuit unit is further configured to receive second data. The memory control circuit unit is further configured to instruct to temporarily store the first data in a buffer area of the rewritable non-volatile memory module. The memory control circuit unit is further configured to instruct to perform a first data obtaining operation corresponding to the first lower physical programming unit to obtain third data, wherein the first data obtaining operation includes reading the first data from the buffer area. The memory control circuit unit is further configured to transmit a second write command sequence to program the second data into a first upper physical programming unit among the upper physical programming units according to the third data.

According to another exemplary embodiment of the disclosure, a memory control circuit unit for controlling a rewritable non-volatile memory module is provided. The rewritable non-volatile memory module includes a plurality of physical erasing units, and a first physical erasing unit among the physical erasing units includes a plurality of lower physical programming units and a plurality of upper physical programming units corresponding to the lower physical programming units. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to receive first data and transmit a first write command sequence to program the first data into a first lower physical programming unit among the lower physical programming units. The memory management circuit is further configured to instruct to temporarily store the first data in a buffer area of the rewritable non-volatile memory module. The memory management circuit is further configured to receive second data. The memory management circuit is further configured to instruct to perform a first data obtaining operation corresponding to the first lower physical programming unit to obtain third data, wherein the first data obtaining operation includes reading the first data from the buffer area. The memory management circuit is further configured to transmit a second write command sequence to program the second data into a first upper physical programming unit among the upper physical programming units according to the third data.

To sum up, during the process of programming an upper physical programming unit corresponding to a specific lower physical programming units, a data storage state of the lower physical programming unit is obtained through a data obtaining operation which does not includes reading data from a memory cell by using a default read voltage of the lower physical programming units. Thereby, the probability of errors occurring in a final programming result due to mistakenly determining a storage state of the memory cells by using the default read voltage to read the memory cells.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 9 is a schematic diagram of managing physical erasing units according to an exemplary embodiment of the disclosure.

FIG. 10 is a schematic diagram of programming a plurality of physical programming units according to an exemplary embodiment of the disclosure.

DESCRIPTION OF THE EMBODIMENTS

Figure 1:
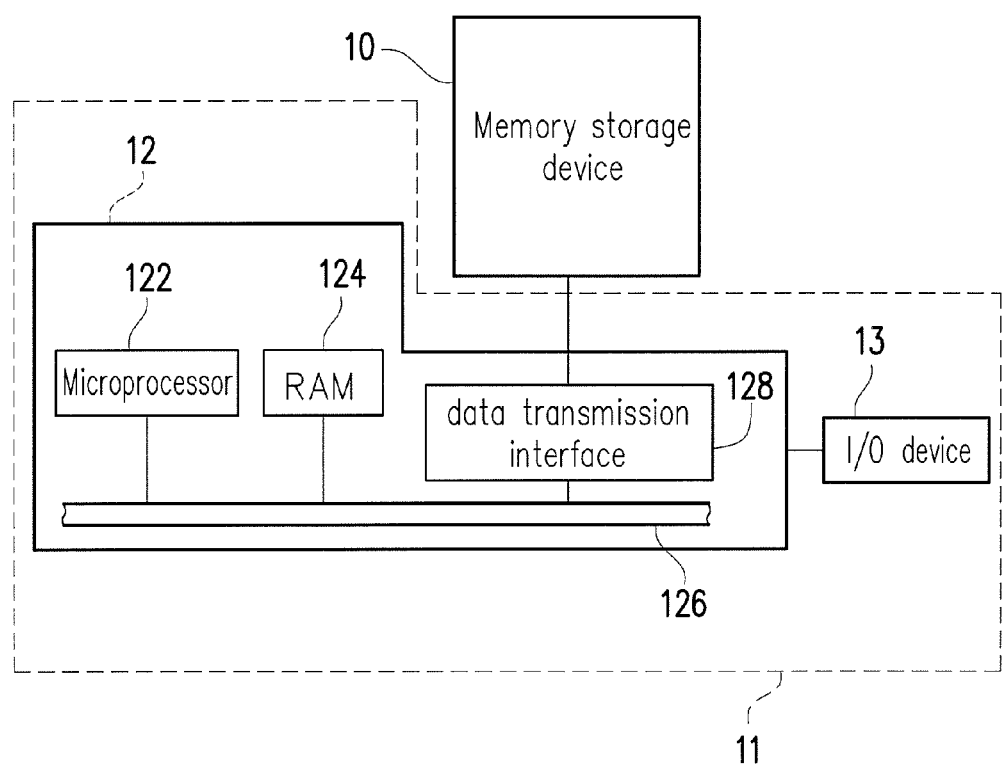
FIG. 1 is a schematic diagram showing a host system and a memory storage device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may include any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least on of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage device (i.e., a memory storage system), typically, includes a rewritable non-volatile memory module and a controller (i.e., a control circuit). The memory storage device is usually used together with a host system so that the host system can write data into or read data from the memory storage device.

Figure 2:
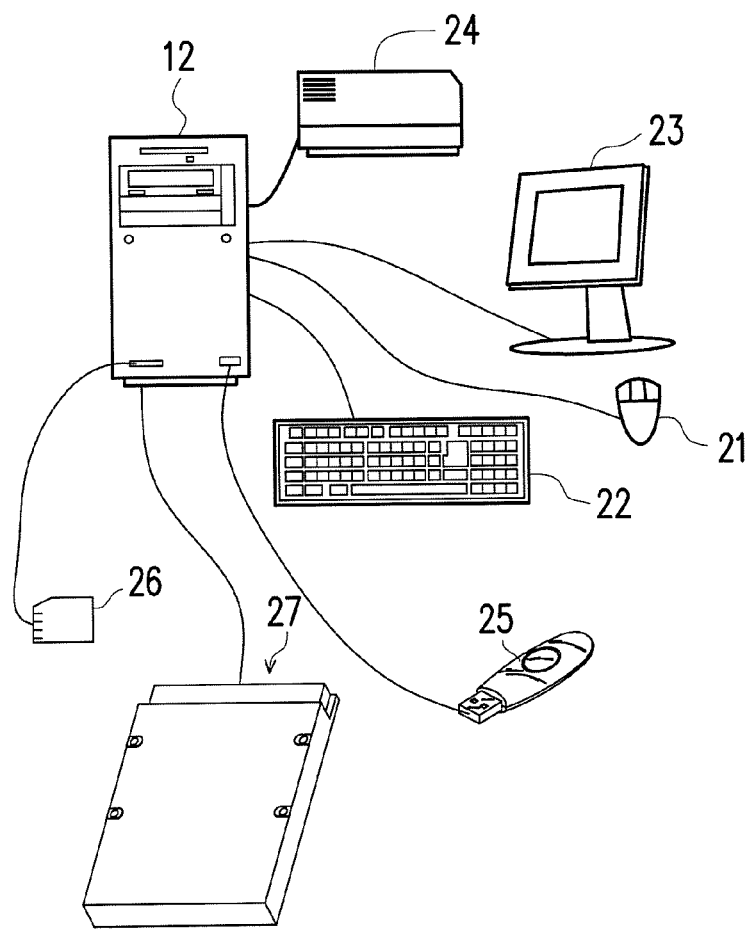
FIG. 2 is a schematic diagram showing a computer, an input/output device, and a memory storage device according to an exemplary embodiment of the disclosure.

FIG. 1 is a schematic diagram showing a host system and a memory storage device according to an exemplary embodiment of the disclosure. FIG. 2 is a schematic diagram showing a computer, an input/output device, and a memory storage device according to an exemplary embodiment of the disclosure.

With reference to FIG. 1, a host system 11 generally includes a computer 12 and an input/output (I/O) device 13. The computer 12 includes a microprocessor 122, a random access memory (RAM) 124, a system bus 126, and a data transmission interface 128. The I/O device 13 includes a mouse 21, a keyboard 22, a display 23, and a printer 24 as shown in FIG. 2. It should be understood that the devices illustrated in FIG. 2 are not intended to limit the I/O device 13, and the I/O device 13 may further include other devices.

In an exemplary embodiment, the memory storage device 10 is coupled to other elements of the host system 11 through the data transmission interface 128. Through operations of the microprocessor 122, the random access memory 124 and the I/O device 13, data is written to or read from the memory storage device 10. For instance, the memory storage device 10 may be a rewritable non-volatile memory storage device, such as a flash drive 25, a memory card 26, or a solid state drive (SSD) 27, as shown in FIG. 2.

Figure 3:
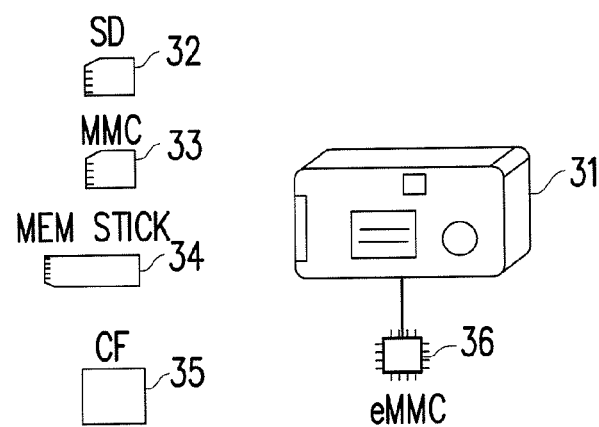
FIG. 3 is a schematic diagram showing a host system and a memory storage device according to an exemplary embodiment of the disclosure.

FIG. 3 is a schematic diagram showing a host system and a memory storage device according to an exemplary embodiment of the disclosure.

Generally, the host system 11 can substantially be any system collocated with the memory storage device 10 for storing data. Even though the host system 11 is described as a computer system in the present exemplary embodiment, in another exemplary embodiment of the disclosure, the host system 11 may be a digital camera, a video camera, a communication device, an audio player, or a video player. For example, if the host system is a digital camera (video camera) 31, the rewritable non-volatile memory storage device is then a secure digital (SD) card 32, a multi media card (MMC) 33, a memory stick 34, a compact flash (CF) card 35, or an embedded storage device 36 (as shown in FIG. 3). The embedded storage device 36 includes an embedded MMC (eMMC). It should be mentioned that the eMMC is directly coupled to a substrate of the host system.

Figure 4:
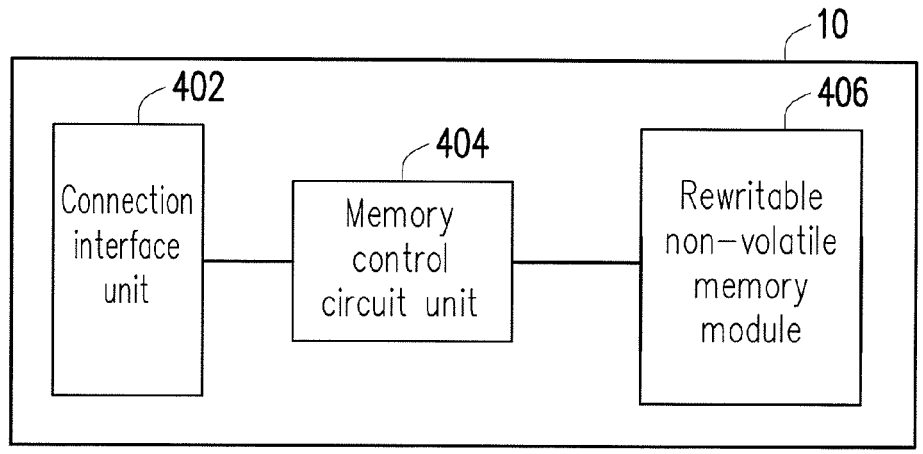
FIG. 4 is a schematic block diagram of the memory storage device shown in FIG. 1.

FIG. 4 is a schematic block diagram of the memory storage device shown in FIG. 1.

With reference to FIG. 4, the memory storage device 10 includes a connection interface unit 402, a memory control circuit unit 404, and a rewritable non-volatile memory module 406.

In the present exemplary embodiment, the connection interface unit 402 complies with the Serial Advanced Technology Attachment (SATA) standard. However, it should be noted that the disclosure is not limited thereto, and the connection interface unit 402 may also comply with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi Media Card (MMC) interface standard, the Embedded Multimedia Card (eMMC) interface standard, the Universal Flash Storage (UFS) interface standard, the Compact Flash (CF) interface standard, the Integrated Device Electronics (IDE) interface standard, or other suitable standards. The connection interface unit 402 may be packaged in a chip together with the memory control circuit unit 404, or the connection interface unit 402 may be disposed outside a chip including the memory control circuit unit 404.

The memory control circuit unit 404 is configured for executing a plurality of logic gates or control commands implemented in a hardware form or in a firmware form and perform various operations, such as data writing, data reading, or data erasing, in the rewritable non-volatile memory module 406 according to a command of the host system 11.

The rewritable non-volatile memory module 406 is coupled to the memory control circuit unit 404 for storing data written by the host system 11. The rewritable non-volatile memory module 406 may be a Single Level Cell (SLC) NAND flash memory module (i.e., a flash memory module in which one memory cell stores 1 bit of data), a Multi Level Cell (MLC) NAND flash memory module (i.e., a flash memory module in which one memory cell stores 2 bits of data), a Triple Level Cell (TLC) NAND flash memory module (i.e., a flash memory module in which one memory cell stores 3 bits of data), other types of flash memory modules, or other memory modules having the same characteristics.

Figure 5:
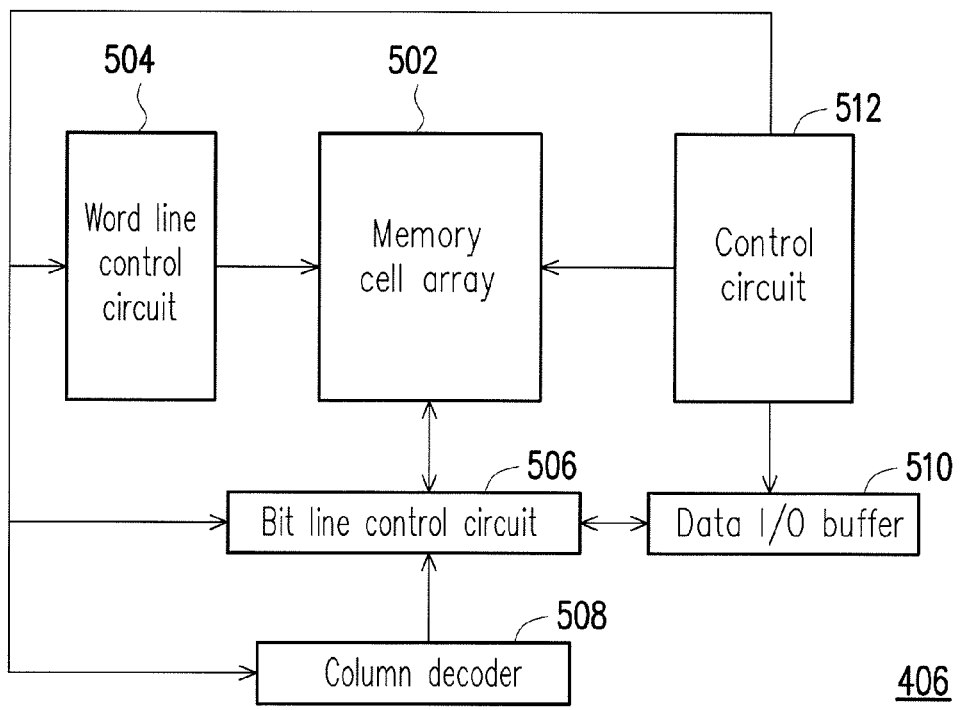
FIG. 5 is a schematic block diagram showing a rewritable non-volatile memory module according to an exemplary embodiment of the disclosure.
Figure 6:
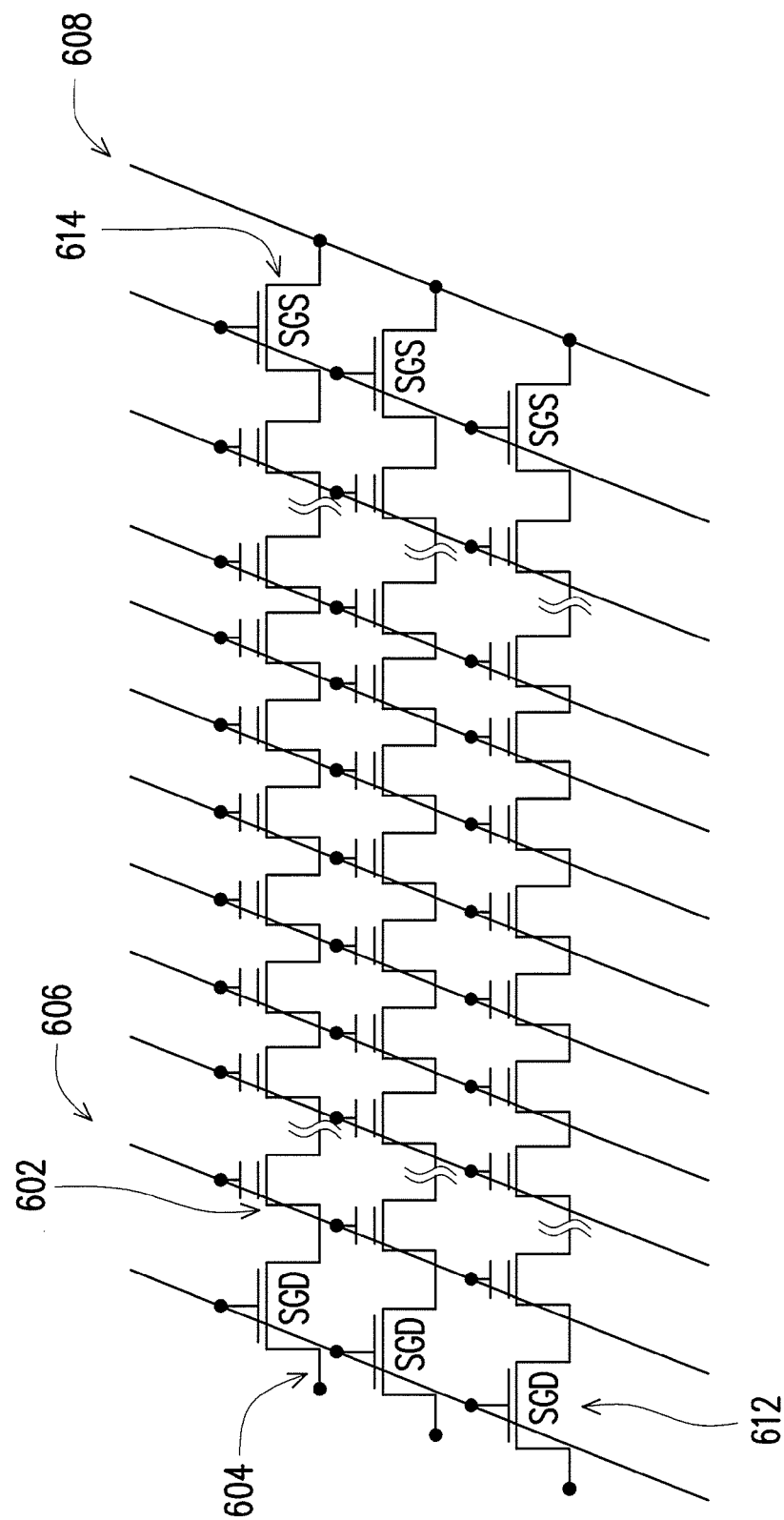
FIG. 6 is a schematic diagram showing a memory cell array according to an exemplary embodiment of the disclosure.

FIG. 5 is a schematic block diagram showing a rewritable non-volatile memory module according to an exemplary embodiment of the disclosure. FIG. 6 is a schematic diagram showing a memory cell array according to an exemplary embodiment of the disclosure.

With reference to FIG. 5, the rewritable non-volatile memory module 406 includes a memory cell array 502, a word line control circuit 504, a bit line control circuit 506, a column decoder 508, a data input/output (I/O) buffer 510, and a control circuit 512.

In the present exemplary embodiment, the memory cell array 502 includes a plurality of memory cells 602 for storing data, a plurality of select gate drain (SGD) transistors 612 and a plurality of select gate source (SGS) transistors 614, and a plurality of bit lines 604, a plurality of word lines 606 and a plurality of common source lines 608 connected with the memory cells (as shown in FIG. 6). The memory cells 602 are arranged in an array (or in a three-dimensional stack manner) and disposed on intersections of the bit lines 604 and the word lines 606. When receiving a write command or a read command from the memory control circuit unit 404, the control circuit 512 controls the word line control circuit 504, the bit line control circuit 506, the column decoder 508, and the data I/O buffer 510 to write data to or read data from the memory cell array 502. The word line control circuit 504 is configured to control a voltage applied to the word lines 606, the bit line control circuit 506 is configured to control a voltage applied to the bit lines 604, the column decoder 508 selects a corresponding bit line according to a decoded row address in the command, and the data I/O buffer 510 is configured to temporarily store data.

Each memory cell in the rewritable non-volatile memory module 406 stores one or more bits by a change of a threshold voltage. Specifically, in each memory cell, a charge trapping layer is provided between a control gate and a channel. Amount of electrons in the charge trapping layer may be changed by applying a write voltage to the control gate, such that the threshold voltage of each memory cells is changed. This process of changing the threshold voltage is also referred to as "writing data into the memory cells" or "programming data into the memory cells." Along with the change of the threshold voltage, each memory cell of the memory cell array 502 has a plurality of storage states. Through a read voltage, to which storage state a memory cell belongs may be determined, and thereby, one or more bits stored in the memory cells may be obtained.

Figure 7:
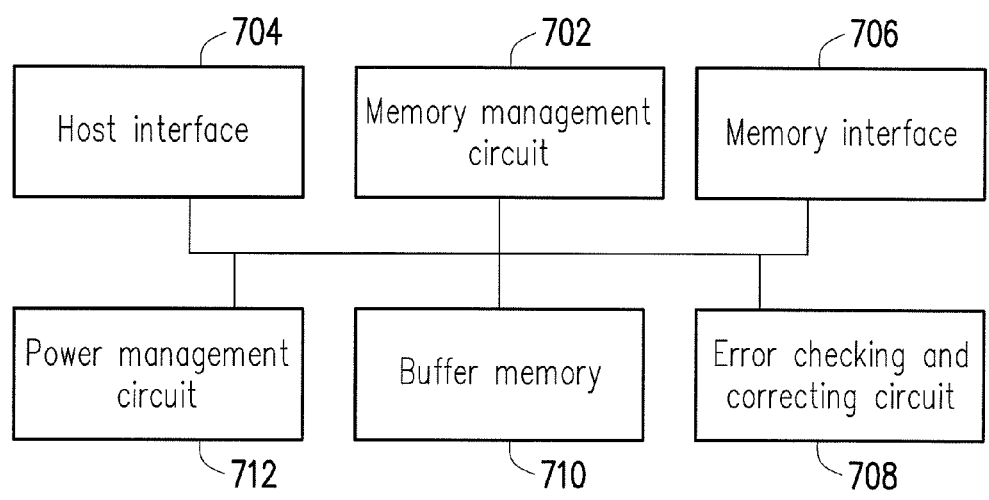
FIG. 7 is a schematic block diagram showing a memory control circuit unit according to an exemplary embodiment of the disclosure.

FIG. 7 is a schematic block diagram showing a memory control circuit unit according to an exemplary embodiment of the disclosure.

With reference to FIG. 7, the memory control circuit unit 404 includes a memory management circuit 702, a host interface 704, a memory interface 706 and an error checking and correcting (ECC) circuit 708.

The memory management circuit 702 is configured for controlling overall operation of the memory control circuit unit 404. Specifically, the memory management circuit 702 has a plurality of control commands. When the memory storage device 10 is operated, the control commands are executed to perform various operations such as data writing, data reading, and data erasing. The following description of the operation of the memory management circuit 702 is equivalent to describing the operation of the memory control circuit unit 404.

In the present exemplary embodiment, the control commands of the memory management circuit 702 are implemented in a firmware form. For instance, the memory management circuit 702 has a microprocessor unit (not shown) and a read-only memory (not shown), and the control commands are burnt into the read-only memory. When the memory storage device 10 is operated, the control commands are executed by the microprocessor unit for performing various data operations, such as data writing, data reading, and data erasing.

In another exemplary embodiment, the control commands of the memory management circuit 702 may also be stored in a specific region (for example, a system region in the memory module exclusively used for storing system data) of the rewritable non-volatile memory module 406 in the form of program codes. Moreover, the memory management circuit 702 has a microprocessor unit (not shown), a read-only memory (not shown), and a random access memory (not shown). In particular, the read-only memory has a boot code, and when the memory control circuit unit 404 is enabled, the boot code is first executed by the microprocessor unit to load the control commands stored in the rewritable non-volatile memory module 406 to the random access memory of the memory management circuit 702. Afterwards, the microprocessor unit executes the control commands for various data operations such as data writing, data reading, and data erasing.

Additionally, in another exemplary embodiment, the control commands of the memory management circuit 702 may be implemented in a hardware form. For example, the memory management circuit 702 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured for managing the physical erasing units of the rewritable non-volatile memory module 406; the memory write circuit is configured for issuing a write command to the rewritable non-volatile memory module 406 in order to write data to the rewritable non-volatile memory module 406; the memory read circuit is configured for issuing a read command to the rewritable non-volatile memory module 406 in order to read data from the rewritable non-volatile memory module 406; the memory erase circuit is configured for issuing an erase command to the rewritable non-volatile memory module 406 in order to erase data from the rewritable non-volatile memory module 406; and the data processing circuit is configured for processing both the data to be written to the rewritable non-volatile memory module 406 and the data read from the rewritable non-volatile memory module 406.

The host interface 704 is coupled to the memory management circuit 702 and configured for receiving and identifying commands and data transmitted from the host system 11. In other words, the commands and data transmitted by the host system 11 are transmitted to the memory management circuit 702 through the host interface 704. In the present exemplary embodiment, the host interface 704 complies with the SATA standard. However, it should be understood that the disclosure is not limited thereto, and the host interface 704 may also comply with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured for accessing the rewritable non-volatile memory module 406. In other words, the data to be written to the rewritable non-volatile memory module 406 is converted to a format acceptable to the rewritable non-volatile memory module 406 by the memory interface 706. Specifically, when the memory management circuit 702 is to access the rewritable non-volatile memory module 406, the memory interface 706 transmits corresponding command sequences. The command sequences may include one or more signals or data on the bus. For example, a read command sequence includes information, such as an identification code and a memory address for reading.

The error checking and correction circuit 708 is coupled to the memory management circuit 702 and configured for executing an error checking and correcting procedure to ensure the correctness of data. To be specific, when the memory management circuit 702 receives a write command from the host system 11, the error checking and correction circuit 708 generates the corresponding error correcting code (ECC) and/or error detecting code (EDC) for data corresponding to the write command, and the memory management circuit 702 writes data corresponding to the write command and the corresponding ECC and/or EDC to the rewritable non-volatile memory module 406. Afterwards, when the memory management circuit 702 reads the data from the rewritable non-volatile memory module 406, the corresponding ECC and/or EDC is also read simultaneously, and the error checking and correction circuit 708 performs the error checking and correcting procedure for the read data based on the ECC and/or EDC.

In an exemplary embodiment, the memory control circuit unit 404 further includes a buffer memory 710 and a power management circuit 712. The buffer memory 710 is coupled to the memory management circuit 702 and configured for temporarily storing data and commands from the host system 11 or data from the rewritable non-volatile memory module 406. The power management circuit 712 is coupled to the memory management circuit 702 and configured for controlling the power of the memory storage device 10.

Figure 8:
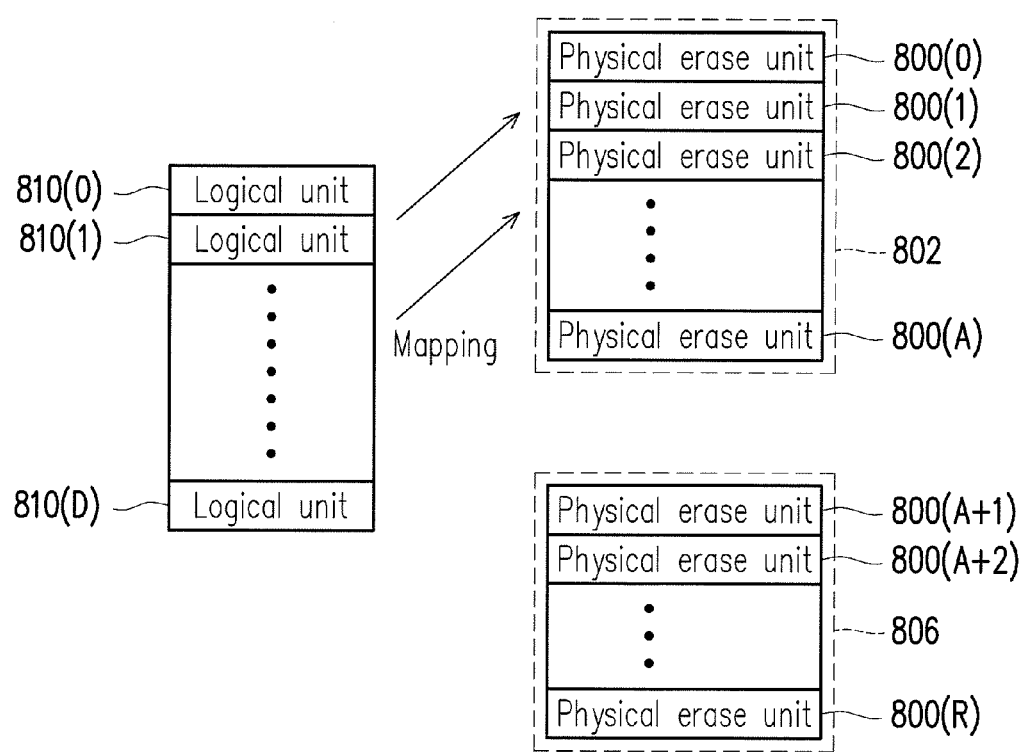
FIG. 8 is a schematic diagram of managing a rewritable non-volatile memory module according to an exemplary embodiment of the disclosure.

FIG. 8 is a schematic diagram of managing a rewritable non-volatile memory module according to an exemplary embodiment of the disclosure. It should be understood that terms, such as "select," "group," "divide," "associate," and so forth, are logical concepts which describe operations on the physical erasing units of the rewritable non-volatile memory module 406. That is, the physical erasing units of the rewritable non-volatile memory module are logically operated, and the actual positions of the physical erasing units are not changed.

The memory cells of the rewritable non-volatile memory module 406 constitute a plurality of physical programming units, and the physical programming unit constitute a plurality of physical erasing units. Specifically, the memory cells on the same word line constitute one or more of the physical programming units. If each memory cell can store more than two bits, the physical programming units on the same word line can be classified into a lower physical programming unit and an upper physical programming unit. For instance, a least significant bit (LSB) of a memory cell belongs to the lower physical programming unit, and a most significant bit (MSB) of the memory cell belongs to the upper physical programming unit. Generally, in the MLC NAND flash memory, a writing speed of the lower physical programming unit is faster than a writing speed of the upper physical programming unit. In addition, a reliability of the lower physical programming unit is higher than a reliability of the upper physical programming unit. In the present exemplary embodiment, a physical programming unit is the smallest unit for programming. That is, a physical programming unit is the smallest unit for writing data. For example, the physical programming unit is a physical page or a physical sector. If the physical programming unit is a physical page, each physical programming unit includes a data bit area and a redundant bit area. The data bit area has a plurality of physical sectors configured for storing user data, and the redundant bit area is configured for storing system data (e.g., an error correcting code). In the present exemplary embodiment, the data bit area includes 32 contains 32 physical sectors, and a size of each physical sector is 512 bytes (B). However, in other exemplary embodiments, the data bit area may also include 8, 16, or more or less of the physical sectors, and amount and sizes of the physical sectors are not limited in the disclosure. On the other hand, a physical erasing unit is the smallest unit for erasing. Namely, each physical erasing unit contains the least number of memory cells to be erased together. For instance, the physical erasing unit is a physical block.

With reference to FIG. 8, the memory management circuit 702 logically divides physical erasing units 800(0)-800(R) of the rewritable non-volatile memory module 406 into a plurality of regions, such as a storage region 802 and a system region 806.

The physical erasing units of the storage region 802 are used for storing the data from the host system 11. The storage region 802 stores valid data and invalid data. For example, if the host system deletes valid data, the deleted data may still be stored in the storage region 802 but marked as invalid data. A physical erasing unit that does not store any valid data is also referred to as a spare physical erasing unit. For example, a physical erasing unit that has been erased becomes one spare physical erasing unit. If a physical erasing unit in the storage region 802 or the system region 806 is damaged, the physical erasing units in the storage region 802 may be used to replace the damaged physical erasing unit. If there is no available physical erasing unit in the storage region 802 for replacing the damaged physical erasing unit, the memory management circuit 702 may announce the entire memory storage device 10 as being in a write protect state and data cannot be written thereto. In addition, a physical erasing unit that stores valid data is also referred to as a non-spare physical erasing unit.

The physical erasing units in the system region 806 are used for recording the system data, which includes information related to the manufacturer and model number of a memory chip, the number of the physical erasing units in the memory chip, the number of the physical programming units of each physical erasing unit, and so forth.

The numbers of the physical erasing units of the storage region 802 and the system region 806 may vary according to different memory specifications. In addition, it should be understood that, during the operation of the memory storage device 10, the grouping relationships of associating the physical erasing units to the storage region 802 and the system region 806 are dynamically changed. For instance, if a physical erasing unit in the system region 806 is damaged and replaced by a physical erasing unit in the storage region 802, the physical erasing unit that is originally in the storage region 802 is associated to the system region 806.

The memory management circuit 702 configures logical units 810(0)-810(D) to be mapped to the physical erasing units 800(0)-800(A) in the storage region 802. For instance, in the present exemplary embodiment, the host system 11 accesses the data in the storage region 802 through a logical address. Thus, each of the logical units 810(0)-810(D) refers to a logical address. In the present exemplary embodiment, a logical address refers to a logical block address (LBA). However, in another exemplary embodiment, a size of a logical address may also be greater or smaller than a size of an LBA. In an exemplary embodiment, each of the logical units 810(0)-810(D) may also refer to a logical sector, a logical programming unit, or a logical erase unit, or may be composed of a plurality of consecutive or dispersed logical addresses. Each of the logical units 810(0)-810(D) is mapped to one or more physical units. In the present exemplary embodiment, a physical unit refers to a physical erasing unit. However, in another exemplary embodiment, a physical unit may also be a physical address, physical sector, a physical programming unit or composed of a plurality of consecutive or dispersed physical addresses, which is not limited in the disclosure. The memory management circuit 702 records a mapping relationship between the logical units and the physical units in one or more logical-physical mapping tables. If the host system 11 is about to read data from or write data to the memory storage device 10, the memory management circuit 702 accesses data of the memory storage device 10 according to the one or more logical-physical mapping tables.

In the present exemplary embodiment, each physical erasing unit includes a plurality of lower physical programming units and a plurality of upper physical programming units corresponding to the lower physical programming units. Herein, the physical programming units which are corresponding to each other refer to the physical programming units belong to the same word line.

FIG. 9 is a schematic diagram of managing physical erasing units according to an exemplary embodiment of the disclosure.

With reference to FIG. 9, taking the physical erasing unit 800(0) as an example, the physical erasing unit 800(0) at least includes lower physical programming units 901A-904A and upper physical programming units 911B-914B. The lower physical programming unit 901A and the upper physical programming unit 911B belong to the same word line. The lower physical programming unit 902A and the upper physical programming unit 912B belong to the same word line. The lower physical programming units 903A and the upper physical programming unit 913B belong to the same word line. The lower physical programming units 904A and the upper physical programming unit 914B belong to the same word line.

Generally, a lower physical programming unit is used (i.e., programmed) prior to an upper physical programming unit on the same word line. The memory management circuit 702 alternately writes data into the lower physical programming units and the upper physical programming units according to a programming order. For instance, a number in each physical programming unit in FIG. 9 indicates programming orders of the physical programming units. In the present exemplary embodiment, lower physical programming units 901A and 902A are first programmed, and then, the upper physical programming unit 911B, the lower physical programming unit 903A, the upper physical programming unit 912B, lower physical programming unit 904A and the upper physical programming unit 913B are sequentially programmed. In the same way, other physical programming units that are not shown are also sequentially programmed similarly. However, in another exemplary embodiment, the memory management circuit 702 may also write data according to another programming order. For instance, the data may be sequentially written into the lower physical programming unit 901A, the upper physical programming unit 911B, the lower physical programming unit 902A, the upper physical programming unit 912B and the lower physical programming unit 903A, or programmed in an order of the lower physical programming units 901A, 902A, 903A, 904A and then, the upper physical programming units 911B, 912B, 913B, which is not limited in the disclosure.

FIG. 10 is a schematic diagram of programming a plurality of physical programming units according to an exemplary embodiment of the disclosure.

With reference to FIG. 10, taking the physical erasing unit 800(0) for example, likewise, it is assumed that the memory management circuit 702 receives data DATA-a to DATA-e in sequence. The data DATA-a to DATA-e may be consecutive or inconsecutive data. Consecutive data refers to data using multiple consecutive logical units and occupies a range of consecutive logical addresses. The inconsecutive data refers to data using multiple inconsecutive logical units and occupies a range of logical addresses that are inconsecutive from one another. Additionally, each of the data DATA-a to DATA-e may be data which is received from the host system 11 and to be stored in the memory storage device 10 (e.g., which is transmitted with a corresponding write command from the host system 11), or may be data that has to be rewrite into the rewritable non-volatile memory module 406 due to a merging procedure or a garbage collection procedure of the physical units.

The memory management circuit 702 may write the data DATA-a to DATA-e according to any programming order that is referred to in the exemplary embodiment of FIG. 9. Herein, the number in each physical programming unit illustrated in FIG. 9 is used as an exemplary programming order. For instance, after receiving the data DATA-a, the memory management circuit 702 programs the data DATA-a into the lower physical programming unit 901A; after receiving the data DATA-b and programming the data DATA-a into the lower physical programming unit 901A, the memory management circuit 702 programs the data DATA-b into the lower physical programming unit 902A; after receiving the data DATA-c and programming the data DATA-b into the lower physical programming unit 902A, the memory management circuit 702 programs the data DATA-c into the upper physical programming unit 911B; after receiving the data DATA-d and programming the data DATA-c into the upper physical programming unit 911B, the memory management circuit 702 programs the data DATA-d into the lower physical programming unit 903A; and after receiving the data DATA-e and programming the data DATA-d into the lower physical programming unit 903A, the memory management circuit 702 programs the data DATA-e into the upper physical programming unit 912B. It is to be mentioned that, memory management circuit 702 instructs the rewritable non-volatile memory module 406 to store (i.e., program) data through transmitting a write command sequence. For instance, the write command sequence may be composed of command codes and/or program codes. The write command sequence may include data to be stored and physical units (e.g., physical addresses) to be used.

Generally, a programming operation on an upper physical programming unit considers a data storage state of its corresponding lower physical programming unit. Thus, if a certain upper physical programming unit is being programmed and the corresponding lower physical programming unit is already programmed, a data storage state of the lower physical programming unit may be mistakenly determined and thereby an error (i.e., storing the wrong data) occurs to at least one of the upper and the lower physical programming units on the same word line.

Figure 11:
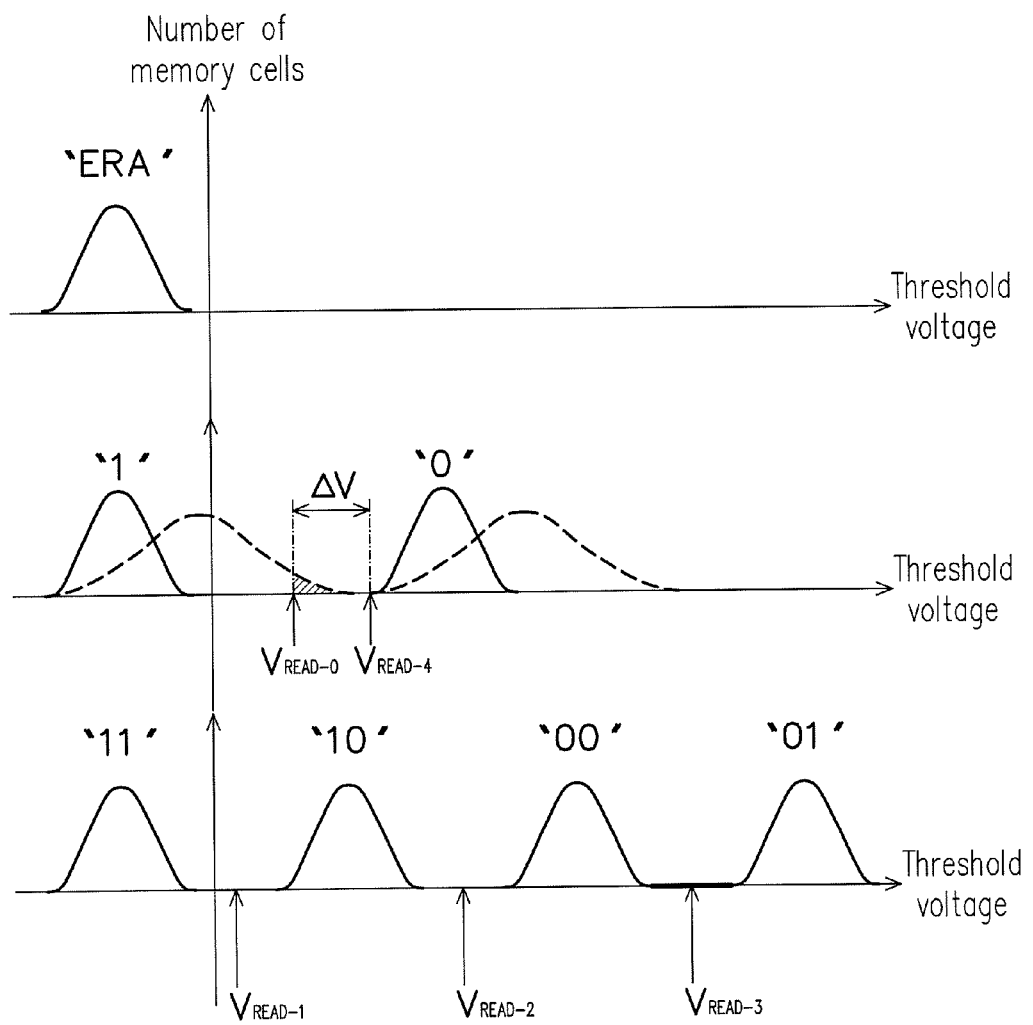
FIG. 11 is a diagram showing a change of threshold voltage distribution of memory cells during a programming process according to an exemplary embodiment of the disclosure.

FIG. 11 is a diagram showing a change of threshold voltage distribution of memory cells during the programming process according to an exemplary embodiment of the disclosure.

With reference to FIG. 10 and FIG. 11, it is assumed that all memory cells in the lower physical programming unit 901A and the upper physical programming units 911B do not store valid data (i.e., in an erase state "ERA") in the beginning After the data DATA-a is programmed into the lower physical programming unit 901A, a part of the memory cells store bits of "1," and the other part stores bits of "0." If the data DATA-c is to be programmed into the upper physical programming unit 911B, a default read voltage $V_{READ\text{-}0}$ is provided to the memory cells in the lower physical programming unit 901A to determine a data storage state of the memory cells. According to the obtained data storage state of the memory cells, the memory cells are further programmed to have four data storage states (i.e., storage bits of "11," "10," "00" and "01"). Afterwards, by applying read voltages $V_{READ\text{-}1}$-$V_{READ\text{-}3}$ to the memory cells, the data storage state of each memory cell may be identified. However, as the usage time of the memory storage device 10 is increased (e.g., the read count is increased, the write count is increased, and/or the erase count is increased and so forth), degradation may occur in the memory cells in the rewritable non-volatile memory module 406. A threshold voltage distribution range of the degraded memory cells becomes wider, as shown by the dotted line in FIG. 11. Therefore, if the fixed default read voltage $V_{READ\text{-}0}$ is still used to read the memory cells during the programming of the upper physical programming unit 911B, a data storage state of the lower physical programming unit 901A may be mistakenly determined, which finally leads to both the lower physical programming unit 901A and the upper physical programming unit 911B storing the wrong data. For instance, if the memory cells in the slashed region shown in FIG. 11 are mistakenly determined as storing bits of "0" due to using the default read voltage $V_{READ\text{-}0}$ to read the memory cells, the memory cells that should originally be programmed to store bits of "11" may be programmed to store bits of "01." In the decoding procedure where the wrong data are read from the memory and corrected, such error is not easily to be found and corrected.

Referring to FIG. 10 again, in the present exemplary embodiment, the memory management circuit 702 determines a storage address of each data in the rewritable non-volatile memory module 406. If the memory management circuit 702 is to program the data DATA-c into the upper physical programming unit 911B, the memory management circuit 702 performs a data obtaining operation to obtain the data storage state of the lower physical programming unit 901A. The data storage state may be a threshold voltage distribution of the memory cells or the data DATA-a.

Additionally, in another exemplary embodiment, the data obtaining operation may be performed by the rewritable non-volatile memory module 406 or other circuits under instruction by a data obtaining command transmitted from the memory management circuit 70. Specially, the data obtaining operation does not include reading the lower physical programming unit 901A by using a default read voltage. In this case, the default read voltage refers to a read voltage (e.g., the default read voltage $V_{READ\text{-}0}$ shown in FIG. 11) that is not adaptively adjusted according to the usage state and/or the data storage state of the lower physical programming unit 901A. After obtaining the data storage state of the lower physical programming unit 901A, the memory management circuit 702 transmits a write command sequence to the rewritable non-volatile memory module 406 according to the data storage state of the lower physical programming unit 901A to instruct to program the data DATA-c into the upper physical programming unit 911B based on the data storage state of the lower physical programming unit 901A.

In an exemplary embodiment of FIG. 10, the memory management circuit 702 obtains a wear degree value of the lower physical programming unit 901A. The wear degree value is related to at least one of the read count, the write count, the erase count, the number of error bits, an error bit rate and a threshold voltage distribution of the memory cells of the lower physical programming unit 901A or the physical erasing unit 800. The wear degree value may be used to indicate various factors that may affect the threshold voltage distribution of the memory cells, such as a wear degree of the memory cells. According to the wear degree value of the lower physical programming unit 901A, the memory management circuit 702 instruct to adjust a read voltage corresponding to the lower physical programming unit 901A from a first read voltage to a second read voltage. For instance, a voltage value of the second read voltage is greater or less than a voltage value of the first read voltage. The first read voltage may be the default read voltage corresponding to the lower physical programming unit 901A or a read voltage that has been adjusted for at least once. Taking FIG. 11 for example, if a default voltage value of the default read voltage $V_{READ\text{-}0}$ is plus a voltage adjustment value $\Delta V$, then reading the memory cells by using the adjusted read voltage (e.g., the read voltage $V_{READ\text{-}4}$) can contribute to reducing a probability of the aforementioned mistaken determination. In the present exemplary embodiment, a value of the voltage adjustment value $\Delta V$ is default. For instance, a voltage increment which is used for adjusting the first read voltage to second read voltage each time is a default increment. However, in another exemplary embodiment, the value of the voltage adjustment value $\Delta V$ is not default. For instance, the value of the voltage adjustment value $\Delta V$ in FIG. 11 may be adaptively determined according to the current wear degree value of the lower physical programming unit 901A. In an exemplary embodiment, the voltage increment for adjusting the first read voltage to the second read voltage is positively related to the wear degree of the lower physical programming unit 901A. Namely, if the current wear degree value of the lower physical programming unit 901A indicates that the wear degree of the memory cells in the lower physical programming unit 901A is high, the value of the voltage adjustment value $\Delta V$ may be correspondingly increased; if the current wear degree value of the lower physical programming unit 901A indicates that the wear degree of the memory cells in the lower physical programming unit 901A is not high, the value of the voltage adjustment value $\Delta V$ may be correspondingly decreased.

Additionally, in another exemplary embodiment, the memory management circuit 702 may also scan memory cells in the lower physical programming unit 901A and determine the voltage adjustment value ΔV according to the threshold voltage distribution of the memory cells in the lower physical programming unit 901A.

In another exemplary embodiment, the memory management circuit 702 dynamically determines whether to perform the aforementioned read voltage adjustment operation. For instance, the memory management circuit 702 determines whether the wear degree value of the lower physical programming unit 901A meets a wear threshold. The wear degree value may be represented by one of or a combination of the erase count, the read count, the write count, the number of error bits and an error bit rate. For instance, if the wear degree value is presented by the erase count, the wear threshold may be 3000-5000. The wear threshold serves as a basis for determining whether the accuracy of the data stored in the memory cells is still effectively maintained. Wear thresholds corresponding to different types of memory cells may be different. If the wear degree value of the lower physical programming unit 901A meets the wear threshold, e.g., the erase count of the memory cells in the lower physical programming unit 901A reaches 3000, it indicates that the accuracy of the data stored in the lower physical programming unit 901A can no longer effectively maintained, and thus, the memory management circuit 702 enables the operation of adjusting the read voltage of the lower physical programming unit 901A according to the wear degree value of the lower physical programming unit 901A. By contrast, if the wear degree value of the lower physical programming unit 901A does not meet the wear threshold, e.g., the erase count of the lower physical programming unit 901A does not reach 3000 times, the memory management circuit 702 does not enable the operation of adjusting the read voltage of the lower physical programming unit 901A according to the wear degree value of the lower physical programming unit 901A. In other words, if the wear degree value of the lower physical programming unit 901A does not meet the wear threshold, the memory management circuit 702 may still read the memory cells in the lower physical programming unit 901A by using the default read voltage (e.g., the default read voltage $V_{READ-0}$) to obtain the data storage state of the lower physical programming unit 901A. Additionally, in the preceding exemplary embodiment, the memory management circuit 702 transmits a read voltage adjustment command to the rewritable non-volatile memory module 406. The read voltage adjustment command instructs the rewritable non-volatile memory module 406 to perform the operation of adjusting the read voltage.

In an exemplary embodiment, the memory management circuit 702 also instructs the error checking and correction circuit 708 to decode the data obtained in the data obtaining operation and determine whether a decoding failure occurs after decoding the data obtained in the data obtaining operation. The decoding operation may include iterative decoding or non-iterative decoding. If a decoding failure occurs after decoding the data obtained in the data obtaining operation, e.g., the number of times of performing an iterative decoding operation is over a default number, the memory management circuit 702 adjusts again the previously used read voltage and read the same lower physical programming unit again by using the adjusted read voltage. For instance, the memory management circuit 702 may instruct to adjust the second read voltage as third read voltage with a greater voltage value and instruct to read the lower physical programming unit 901A again by using the third read voltage. Then, the error checking and correction circuit 708 re-decodes the data that is read by using the third read voltage. The memory management circuit 702 and the error checking and correction circuit 708 may repeatedly perform the operations of adjusting the read voltage and decoding the read data in one data obtaining operation, until the decoding operation is successful or the number of times of the decoding failure reaches a decoding times threshold.

In another exemplary embodiment of FIG. 10, the data obtaining operation may not provide any read voltage to the memory cells in the lower physical programming unit 901A. For instance, in an exemplary embodiment, whenever data to be written into the rewritable non-volatile memory module 406 is received, the data is temporarily stored in the buffer memory 710 and at least maintained until it is no longer needed. For example, in an exemplary embodiment of FIG. 10, the data DATA-a temporarily stored in the buffer memory 710 is at least maintained until the data DATA-c is programmed into the upper physical programming unit 911B. In this way, while an upper physical programming unit corresponding to a certain lower physical programming unit is programmed, data stored in the lower physical programming unit may be read from buffer memory 710, such that a probability of reading a wrong data storage state of the lower physical programming unit may be reduced.

In the preceding exemplary embodiment, a capacity (i.e., a size) of the buffer memory 710 or a space in the buffer memory 710 used for temporarily storing the data to be written into the rewritable non-volatile memory module 406 is not less than a default size. For instance, if the data is stored in the programming order shown in FIG. 9, the default size is at least three or four times a size of one physical programming unit in the rewritable non-volatile memory module 406. Namely, before the programming operation on the data DATA-c is completed, the buffer memory 710 at least has to store the data DATA-a, DATA-b and DATA-c simultaneously; and before the programming operation on the data DATA-e is completed, buffer memory 710 the buffer memory 710 at least has to store the data DATA-b, DATA-d and DATA-e or the data DATA-b, DATA-c, DATA-d and DATA-e. Additionally, if the programming order as used is different, the default size may also be adaptively adjusted as long as the data in the buffer memory 710 that still has to be used can be effectively maintained. Additionally, in another exemplary embodiment, a buffer area may also be configured in the rewritable non-volatile memory module 406. The buffer area does not include real storage positions of the data. For instance, the buffer area may provide the same or similar function of the buffer memory 710. Additionally, a size of the buffer area is at least greater than the default size. In an exemplary embodiment, a reliability and/or a data writing speed of physical units in the buffer area is faster than or equal to a reliability and/or a data writing speed of physical units in another area in the rewritable non-volatile memory module 406.

Figure 12A:
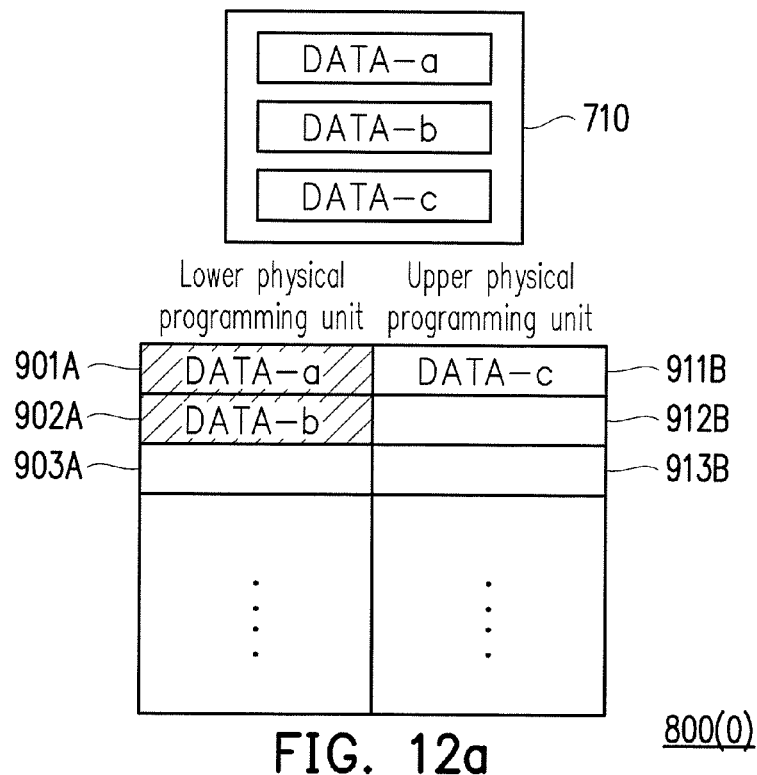
FIGS. 12a to 12c are schematic diagrams of programming data according to an exemplary embodiment of the disclosure.
Figure 12B:
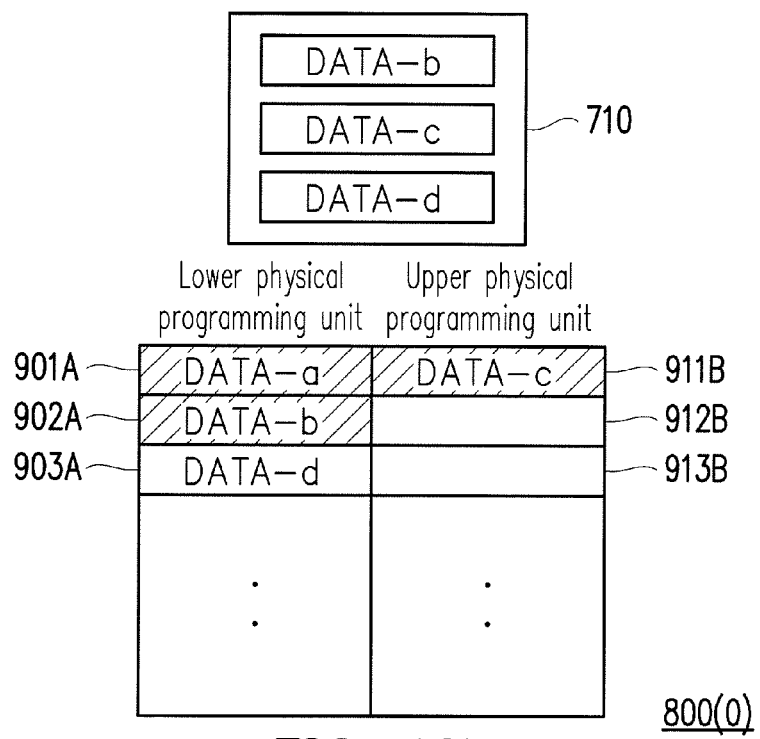
Figure 12C:
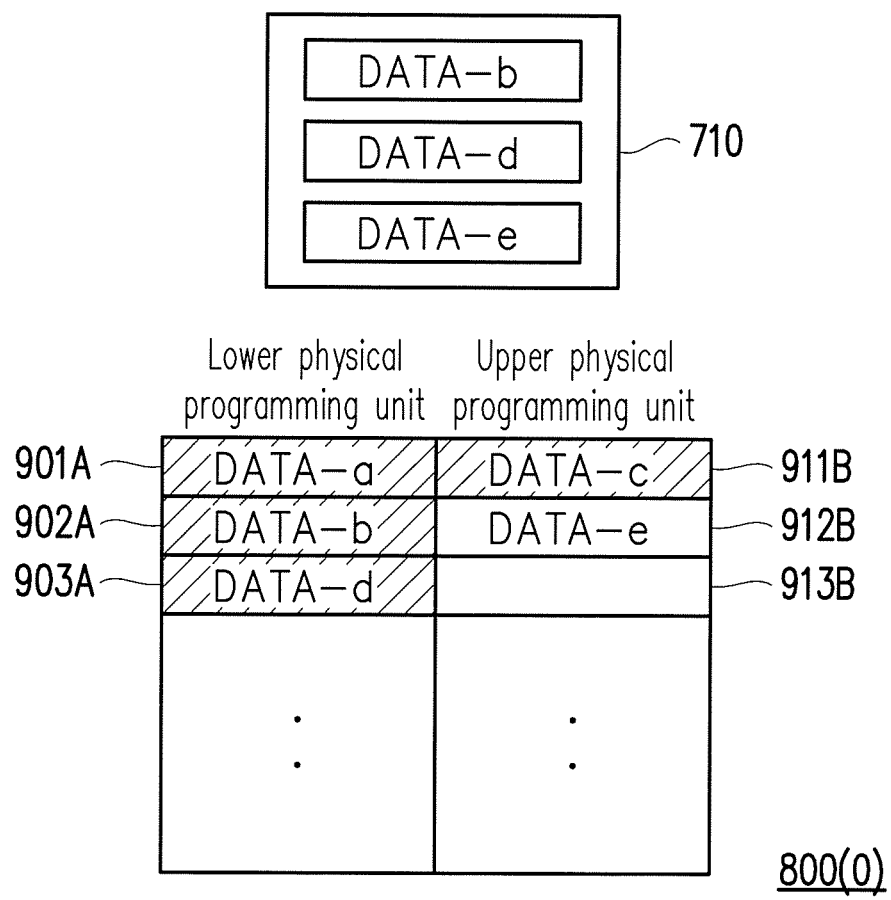

FIGS. 12*a* to 12*c* are schematic diagrams of programming data according to an exemplary embodiment of the disclosure.

With reference to FIG. 12*a*, it is assumed that the data DATA-a and DATA-b is temporarily stored in the buffer memory 710, and the data DATA-a and DATA-b is sequentially programmed in to the lower physical programming units 901A and 902A. The memory management circuit 702 receives the data DATA-c and temporarily store the data DATA-c in the buffer memory 710. If the memory management circuit 702 is to program the data DATA-c into the upper physical programming unit 911B, the memory management circuit 702 reads the data DATA-a from the buffer memory 710. Then, the memory management circuit 702 programs the data DATA-c into the upper physical programming unit 911B according to the read data DATA-a. Details regarding how to program has been described in the exemplary embodiments above and will not be repeated hereinafter. Specially, the programming operation of the upper physical programming unit 911B is not based on the "real" data storage state of the lower physical programming unit 901A, and thus, a probability of errors occurring during programming the upper physical programming unit 911B due to inaccurate data stored in the lower physical programming unit 901A can be reduced. It is to be mentioned that in the exemplary embodiment illustrated in FIGS. 12a to 12c, data in the buffer memory 710 that does not need to be used any more may be set as overwritable. For example, after the data DATA-c is programmed into the upper physical programming unit 911B, the data DATA-a and DATA-c in the buffer memory 710 may be set to be overwritable.

With reference to FIG. 12b, after the data DATA-d is received, the data DATA-d is temporarily stored in the buffer memory 710. In this case, due to the limitation of the capacity of the buffer memory 710, the data DATA-a may be overwritten by the data DATA-d. In an exemplary embodiment, the data DATA-d is received by the memory management circuit 702 only when the completion of the data obtaining operation of the data DATA-a, or the data DATA-c being successfully programmed into the upper physical programming unit 911B is confirmed. In other words, in an exemplary embodiment, the memory management circuit 702 is in a busy state and not allowed to receive the data DATA-d until the data obtaining operation of the data DATA-a is completed or the data DATA-c is successfully programmed into the upper physical programming unit 911B; and the memory management circuit 702 is switched to an idle state and allowed to receive the data DATA-d when the data obtaining operation of the data DATA-a is completed or the data DATA-c is successfully programmed into the upper physical programming unit 911B. Thereafter, the data DATA-d is programmed into the lower physical programming unit 903A.

With reference to FIG. 12c, after the data DATA-d is received and the memory management circuit 702 is in the idle state, the data DATA-e is received (e.g., overwrites the data DATA-c) and is temporarily stored in the buffer memory 710. After the data DATA-d is programmed into the lower physical programming unit 903A, if the memory management circuit 702 is to program the data DATA-e into the upper physical programming unit 912B, the memory management circuit 702 reads the data DATA-b from the buffer memory 710. Then, the memory management circuit 702 programs the data DATA-e into the upper physical programming unit 912B according to the data DATA-b read from the buffer memory 710. In this case, the operation of the memory management circuit 702 reading the data DATA-b from the buffer memory 710 is the data obtaining operation corresponding to the lower physical programming unit 902A.

It is to be mentioned that, in another exemplary embodiment of FIGS. 12a to 12c, the buffer memory 710 may also be substituted by the buffer area in the rewritable non-volatile memory module 406. Alternatively, the buffer memory 710 and the buffer area in the rewritable non-volatile memory module 406 may be used together or alternately. For instance, the data DATA-a, DATA-b and DATA-c may be temporarily stored in the buffer memory 710, while the data DATA-d and DATA-e may be temporarily stored in the buffer area in the rewritable non-volatile memory module 406, and so forth. Additionally, in another exemplary embodiment of FIGS. 12a to 12c, the data obtaining operation corresponding to the lower physical programming unit 902A and the lower physical programming unit 901A may include an operation of reading the corresponding memory cells by using an adjusted read voltage. Details regarding the operation of how to adjust the read voltage and read the memory cells by using the adjusted read voltage has been described above and will not be repeated hereinafter.

In the exemplary embodiments above, a size (i.e., a data size) of each of the data DATA-a, DATA-b, DATA-c, DATA-d and DATA-e meets a size of one physical programming unit. However, in another exemplary embodiment, the size of each of the data DATA-a, DATA-b, DATA-c, DATA-d and DATA-e may be less than the size of one physical programming unit, which is not limited in the disclosure. Additionally, even though the above exemplary embodiments illustrates the programming of a plurality of physical programming units in the same physical erasing unit for example, in another exemplary embodiment, a plurality of physical programming units belonging to different physical erasing units may also be consecutively or inconsecutively programmed.

Figure 13:
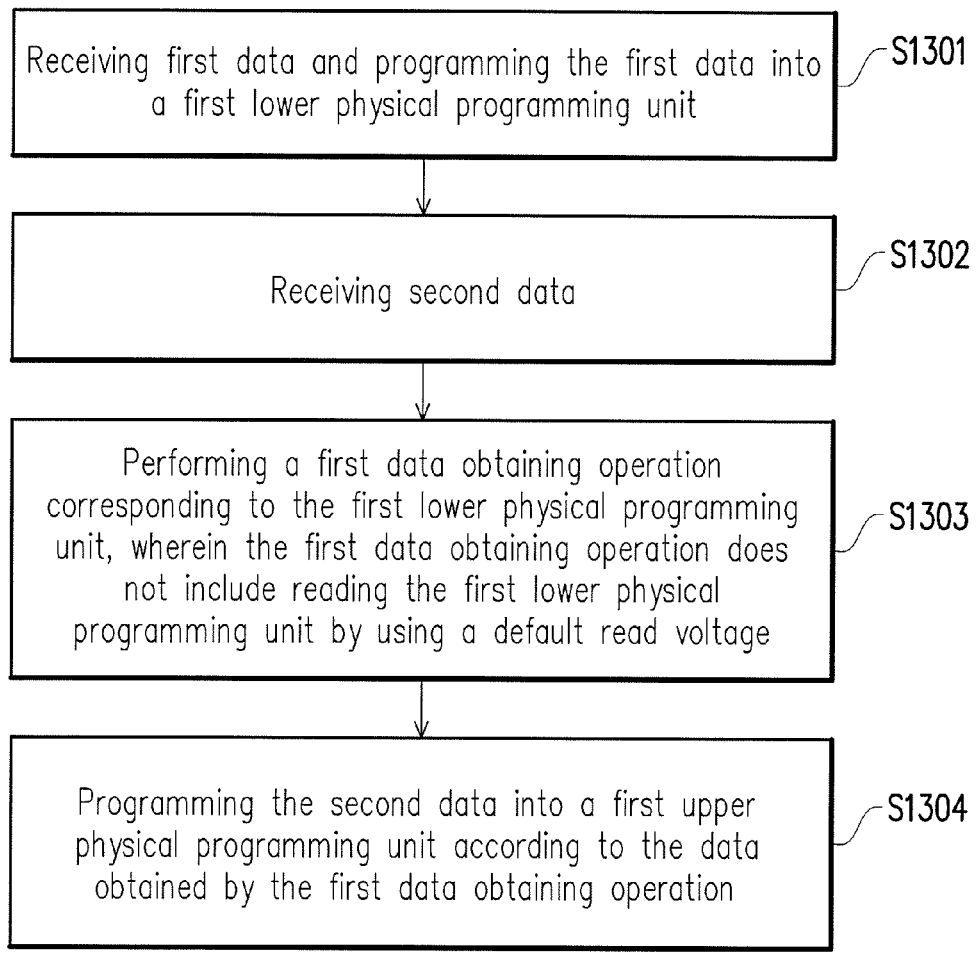
FIG. 13 is a flowchart showing a data programming method according to an exemplary embodiment of the disclosure.

FIG. 13 is a flowchart showing a data programming method according to an exemplary embodiment of the disclosure.

With reference to FIG. 13, in step S1301, data (also referred to as first data) is received and programmed into a lower physical programming unit (also referred to as first lower physical programming unit). In step S1302, another data (also referred to as second data) is received. In step S1303, a data obtaining operation (also referred to as a first data obtaining operation) corresponding to the first lower physical programming unit is performed. Particularly, the first data obtaining operation does not include reading the first lower physical programming unit by using a default read voltage corresponding to the first lower physical programming unit. For instance, the first data obtaining operation may include reading the first lower physical programming unit by using one or more read voltages different from the default read voltage or reading data stored in the first lower physical programming unit from a buffer memory or a buffer area in the rewritable non-volatile memory module. In step S1304, the second data is programmed into a first upper physical programming unit corresponding to the first lower physical programming unit according to data (also referred to as third data) obtained by the first data obtaining operation. However, in another exemplary embodiment, steps S1301 and S1302 may also be simultaneously performed.

Figure 14:
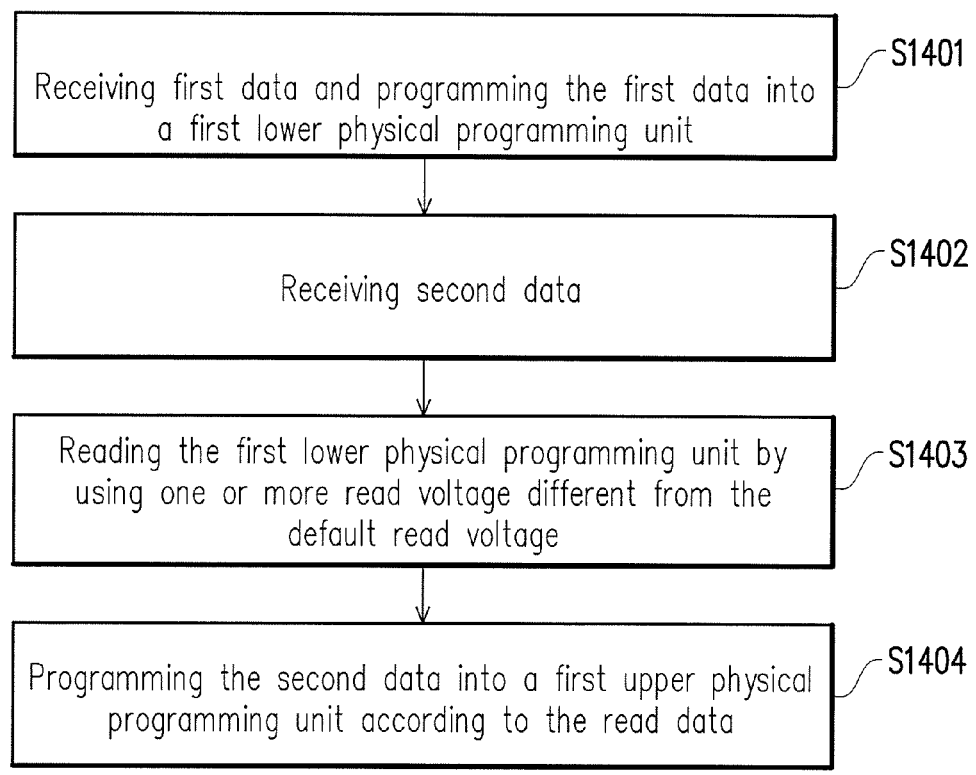
FIG. 14 is a flowchart showing a data programming method according to another exemplary embodiment of the disclosure.

FIG. 14 is a flowchart showing a data programming method according to another exemplary embodiment of the disclosure.

With reference to FIG. 14, in step S1401, the first data is received and programmed into a first lower physical programming unit. In step S1402, the second data is received. In step S1403, if the second data is to be programmed into the first upper physical programming unit corresponding to the first lower physical programming unit, the one or more read voltage different from the default read voltage corresponding to the first lower physical programming unit is used to read the first lower physical programming unit. For example, the one or more read voltage is determined according to a wear degree value of the first lower physical programming unit. In step S1404, according to the data read in step S1403, the second data is programmed into the first upper physical programming unit. However, in another exemplary embodiment, steps S1401 and S1402 may also be simultaneously performed.

Figure 15:
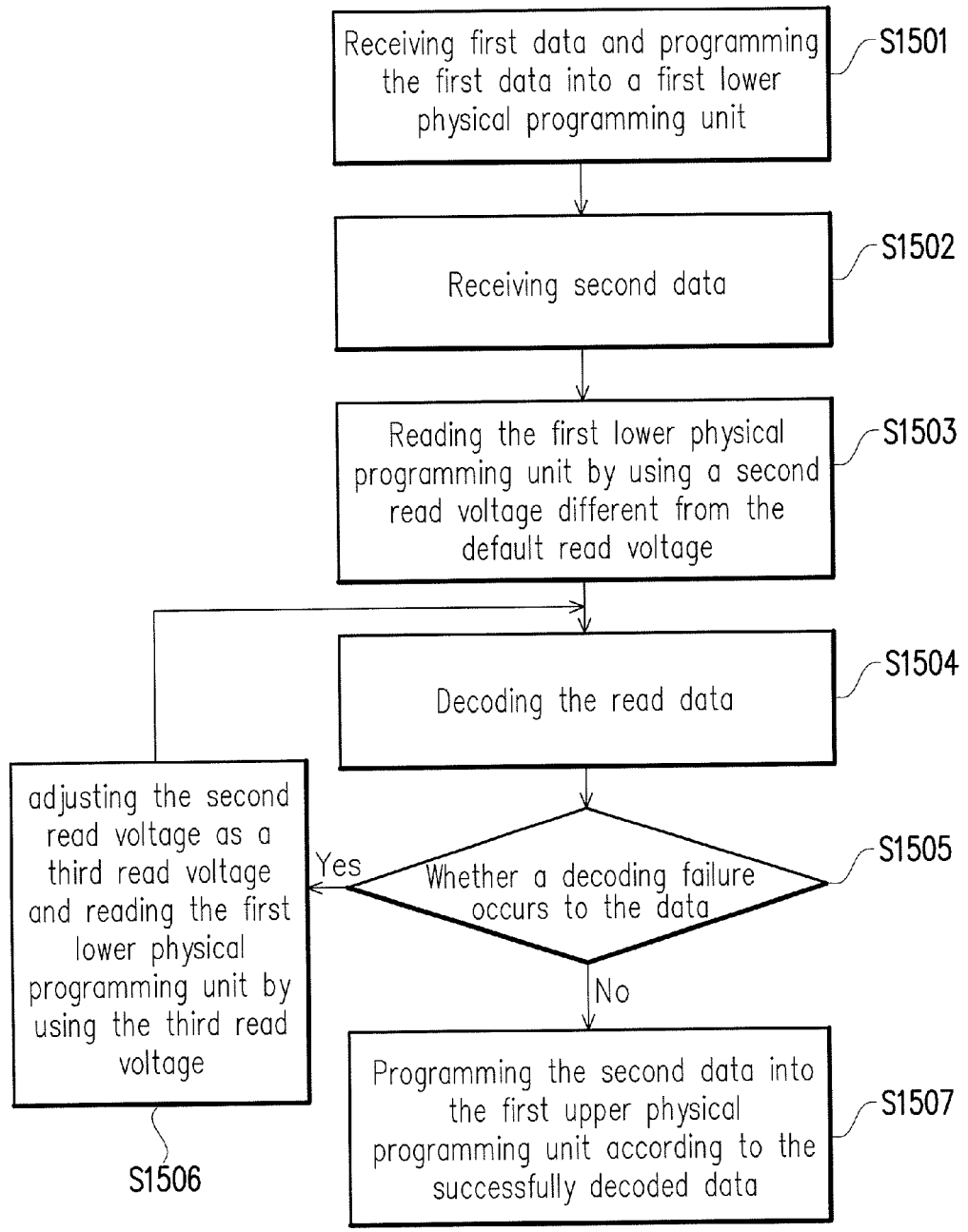
FIG. 15 is a flowchart showing a data programming method according to another exemplary embodiment of the disclosure.

FIG. 15 is a flowchart showing a data programming method according to another exemplary embodiment of the disclosure.

With reference to FIG. 15, in step S1501, the first data is received and programmed into the first lower physical programming unit. In step S1502, the second data is received. In step S1503, if the second data is to be programmed into the first upper physical programming unit corresponding to the first lower physical programming unit, a read voltage (also referred to as a second read voltage) different from the default read voltage corresponding to the first lower physical programming unit is used to read the first lower physical programming unit. For example, the second read voltage is determined according to the wear degree value of the first lower physical programming unit. In step S1504, data (also referred to as fourth data) obtained in step S1503 is decoded. In step S1505, whether a decoding failure occurs after decoding the fourth data is determined. If the decoding failure occurs after decoding the fourth data, in step S1506, the previously used second read voltage is adjusted as another read voltage (also referred to as a third read voltage), and the third read voltage is used to read the first lower physical programming unit. After step S1506, steps S1504 and S1505 are repeatedly performed, until the fourth data is successfully decoded or the number of occurring the decoding failure reaches a threshold of decoding times. If the fourth data is successfully decoded, in step S1507, the second data is programmed into the first upper physical programming unit according to the successfully decoded data in step S1505. However, in another exemplary embodiment, steps S1501 and S1502 may also be simultaneously performed.

Figure 16:
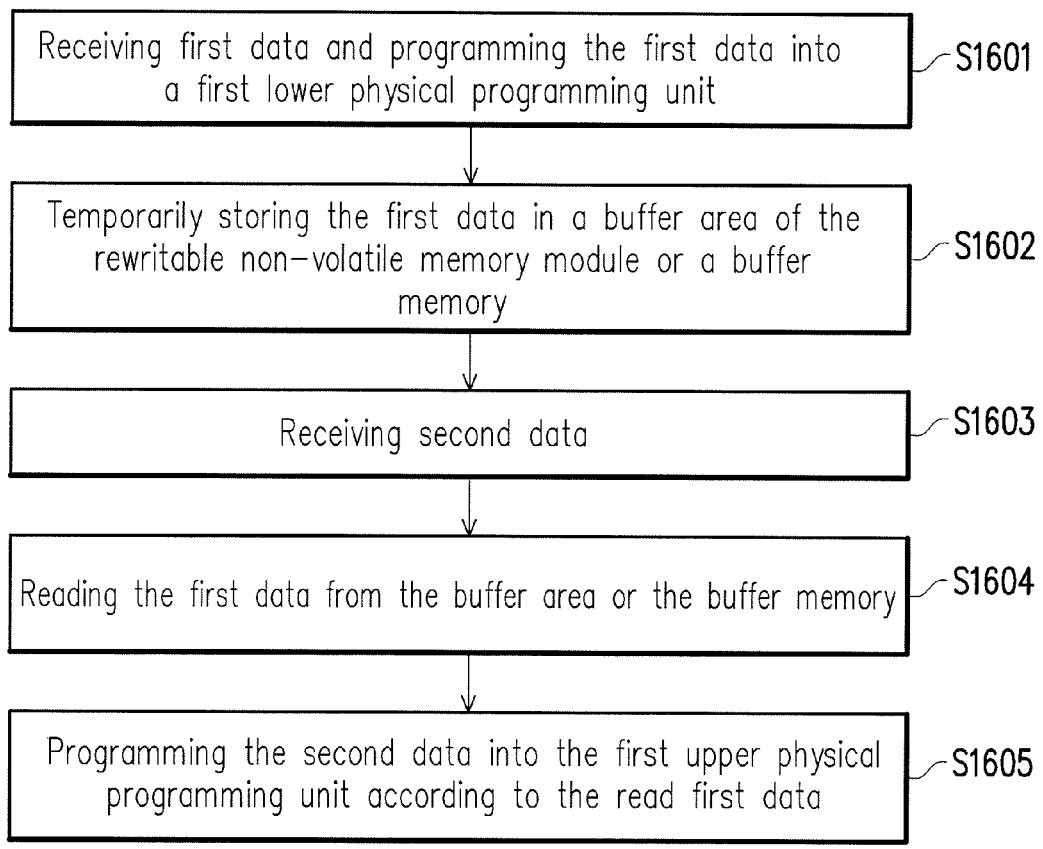
FIG. 16 is a flowchart showing a data programming method according to another exemplary embodiment of the disclosure.

FIG. 16 is a flowchart showing a data programming method according to another exemplary embodiment of the disclosure.

With reference to FIG. 16, in step S1601, the first data is received and programmed into the first lower physical programming unit. In step S1602, the first data is temporarily stored in the buffer memory or the buffer area in the rewritable non-volatile memory module. In step S1603, the second data is received. In step S1604, in response to the second data to be programmed into the first upper physical programming unit corresponding to the first lower physical programming unit, the first data temporarily stored in the buffer memory or the buffer area in the rewritable non-volatile memory module is read. In step S1605, according to the first data read in step S1604, the second data is programmed into the first upper physical programming unit. However, in another exemplary embodiment, steps S1601 and S1602 and/or steps S1602 and S1603 may also be simultaneously performed.

However, each step in FIG. 13 to FIG. 16 has been described above and will not be repeated. It should be noted that, each step in FIG. 13 to FIG. 16 may implemented as a plurality of program codes or circuits, which is not limited in the disclosure. Additionally, the methods of FIG. 13 to FIG. 16 may be used in combination with the above-described exemplary embodiments or be used solely. Nevertheless, the disclosure is not limited thereto.

To summarize, when an upper physical programming unit corresponding to a certain lower physical programming unit is programmed, the disclosure utilizes the data obtaining operations, such as reading the data belonging to the memory cells of the lower physical programming unit by using the adjusted read voltage or reading the data temporarily stored in the buffer memory (or the buffer area in the rewritable non-volatile memory module) to obtain the data storage state of the lower physical programming unit. In this way, the probability of errors occurring in the final programming result due to the data storage state of the memory cells being mistakenly determined can be reduced. The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data programming method, for a rewritable non-volatile memory module, wherein the rewritable non-volatile memory module comprises a plurality of physical erasing units, wherein a first physical erasing unit among the physical erasing units comprises a plurality of lower physical programming units and a plurality of upper physical programming units corresponding to the lower physical programming units, the data programming method comprising:

receiving first data and programming the first data into a first lower physical programming unit among the lower physical programming units;

receiving second data;

performing a first data obtaining operation corresponding to the first lower physical programming unit to obtain third data, wherein the first data obtaining operation comprises reading the first lower physical programming unit by using a second read voltage, wherein a voltage value of the second read voltage is different from a default voltage value of a default read voltage corresponding to the first lower physical programming unit; and programming the second data into a first upper physical programming unit among the upper physical programming units according to the third data.

2. The data programming method according to claim 1, further comprising:

obtaining a wear degree value of the first lower physical programming unit; and adjusting the default read voltage corresponding to the first lower physical programming unit as the second read voltage according to the wear degree value.

3. The data programming method according to claim 1, wherein the step of performing the first data obtaining operation corresponding to the first lower physical programming unit further comprises:

decoding fourth data read by using the second read voltage;

determining whether a decoding failure occurs after decoding the fourth data; and if the decoding failure occurs after decoding the fourth data, adjusting the second read voltage as a third read voltage and reading the first lower physical programming unit by using the third read voltage.

4. The data programming method according to claim 1, wherein the first upper physical programming unit and the first lower physical programming unit belong to a same word line.

5. A memory storage device, comprising:
a connection interface unit, configured to couple to a host system;
a rewritable non-volatile memory module, comprising a plurality of physical units, wherein a first physical erasing unit among the physical erasing units comprises a plurality of lower physical programming units and a plurality of upper physical programming units corresponding to the lower physical programming units; and
a memory control circuit unit, coupled to the connection interface unit and the rewritable non-volatile memory module,
wherein the memory control circuit unit is configured to receive first data and transmit a first write command sequence to program the first data into a first lower physical programming unit among the lower physical programming units,
wherein the memory control circuit unit is further configured to receive second data,
wherein the memory control circuit unit is further configured to instruct to perform a first data obtaining operation corresponding to the first lower physical programming unit to obtain third data, wherein the first data obtaining operation comprises reading the first lower physical programming unit by using a second read voltage, wherein a voltage value of the second read voltage is different from a default voltage value of a default read voltage corresponding to the first lower physical programming unit,
wherein the memory control circuit unit is further configured to transmit a second write command sequence to program the second data into a first upper physical programming unit among the upper physical programming units according to the third data.

6. The memory storage device according to claim 5, wherein the memory control circuit unit is further configured to obtain a wear degree value of the first lower physical programming unit,
wherein the memory control circuit unit is further configured to instruct to adjust the default read voltage corresponding to the first lower physical programming unit as the second read voltage according to the wear degree value.

7. The memory storage device according to claim 5, wherein the first data obtaining operation further comprises:
decoding fourth data read by using the second read voltage;
determining whether a decoding failure occurs after decoding the fourth data; and
if the decoding failure occurs after decoding the fourth data, instructing to adjust the second read voltage as a third read voltage and read the first lower physical programming unit by using the third read voltage.

8. The memory storage device according to claim 5, wherein the first upper physical programming unit and the first lower physical programming unit belong to a same word line.

9. A memory control circuit unit, for controlling a rewritable non-volatile memory module, wherein the rewritable non-volatile memory module comprises a plurality of physical erasing units, wherein a first physical erasing unit among the physical erasing units comprises a plurality of lower physical programming units and a plurality of upper physical programming units corresponding to the lower physical programming units, the memory control circuit unit comprising:
a host interface, configured to couple to a host system;
a memory interface, configured to couple to the rewritable non-volatile memory module; and
a memory management circuit, coupled to the host interface and the memory interface,
wherein the memory management circuit is configured to receive first data and transmit a first write command sequence to program the first data into a first lower physical programming unit among the lower physical programming units,
wherein the memory management circuit is further configured to receive second data,
wherein the memory management circuit is further configured to instruct to perform a first data obtaining operation corresponding to the first lower physical programming unit to obtain third data, wherein the first data obtaining operation comprises reading the first lower physical programming unit by using a second read voltage, wherein a voltage value of the second read voltage is different from a default voltage value of a default read voltage corresponding to the first lower physical programming unit,
wherein the memory management circuit is further configured to transmit a second write command sequence to program the second data into a first upper physical programming unit among the upper physical programming units according to the third data.

10. The memory control circuit unit according to claim 9, wherein the memory management circuit is further configured to obtain a wear degree value of the first lower physical programming unit,
wherein the memory management circuit is further configured to instruct to adjust the default read voltage corresponding to the first lower physical programming unit as the second read voltage according to the wear degree value.

11. The memory control circuit unit according to claim 9, further comprising:
an error checking and correcting circuit, coupled to the memory management circuit,
wherein the first data obtaining operation further comprises:
decoding, by the error checking and correction circuit, fourth data read by using the second read voltage;
determining whether a decoding failure occurs after decoding the fourth data; and
if the decoding failure occurs after decoding the fourth data, instructing to adjust the second read voltage as a third read voltage and read the first lower physical programming unit by using the third read voltage.

12. The memory control circuit unit according to claim 9, wherein the first upper physical programming unit and the first lower physical programming unit belong to a same word line.

13. A data programming method, for a rewritable non-volatile memory module, wherein the rewritable non-volatile memory module comprises a plurality of physical erasing units, wherein a first physical erasing unit among the physical erasing units comprises a plurality of lower physical programming units and a plurality of upper physical programming units corresponding to the lower physical programming units, the data programming method comprising:

receiving first data and programming the first data into a first lower physical programming unit among the lower physical programming units;
temporarily storing the first data in a buffer area of the rewritable non-volatile memory module;
receiving second data;
performing a first data obtaining operation corresponding to the first lower physical programming unit to obtain third data, wherein the first data obtaining operation comprises reading the first data from the buffer area; and
programming the second data into a first upper physical programming unit among the upper physical programming units according to the third data.

14. The data programming method according to claim 13, further comprising:
maintaining continuously the first data temporarily stored in the buffer area until the first data obtaining operation is completed or no failure occurs during programming the second data into the first upper physical programming unit.

15. The data programming method according to claim 13, wherein a size of the buffer area is not less than a default size, wherein the default size is triple a size of one physical programming unit in the rewritable non-volatile memory module.

16. The data programming method according to claim 15, further comprising:
receiving fourth data before receiving the second data;
storing temporarily the fourth data in the buffer area;
programming the fourth data into a second lower physical programming unit among the lower physical programming units;
receiving fifth data after receiving the second data;
storing temporarily the fifth data in the buffer area;
performing a second data obtaining operation corresponding to the second lower physical programming unit, wherein the second data obtaining operation comprises reading the fourth data from the buffer area; and
programming the fifth data into a second upper physical programming unit among the upper physical programming units according to the fourth data obtained by the second data obtaining operation, wherein the second upper physical programming unit is corresponding to the second lower physical programming unit,
wherein the step of programming the fourth data into the second lower physical programming unit is performed between the step of programming the first data into the first lower physical programming unit and the step of programming the second data into the first upper physical programming unit.

17. The data programming method according to claim 13, wherein the first upper physical programming unit and the first lower physical programming unit belong to a same word line.

18. A memory storage device, comprising:
a connection interface unit, configured to couple to a host system;
a rewritable non-volatile memory module, comprising a plurality of physical units, wherein a first physical erasing unit among the physical erasing units comprises a plurality of lower physical programming units and a plurality of upper physical programming units corresponding to the lower physical programming units; and
a memory control circuit unit, coupled to the connection interface unit and the rewritable non-volatile memory module,
wherein the memory control circuit unit is configured to receive first data and transmit a first write command sequence to program the first data into a first lower physical programming unit among the lower physical programming units,
wherein the memory control circuit unit is further configured to receive second data,
wherein the memory control circuit unit is further configured to instruct to temporarily store the first data in a buffer area of the rewritable non-volatile memory module,
wherein the memory control circuit unit is further configured to instruct to perform a first data obtaining operation corresponding to the first lower physical programming unit to obtain third data, wherein the first data obtaining operation comprises reading the first data from the buffer area,
wherein the memory control circuit unit is further configured to transmit a second write command sequence to program the second data into a first upper physical programming unit among the upper physical programming units according to the third data.

19. The memory storage device according to claim 18, wherein the memory control circuit unit is further configured to maintain continuously the first data temporarily stored in the buffer area until the first data obtaining operation is completed or no failure occurs during programming the second data into the first upper physical programming unit.

20. The memory storage device according to claim 18, wherein a size of the buffer area is not less than a default size, wherein the default size is triple a size of one physical programming unit in the rewritable non-volatile memory module.

21. The memory storage device according to claim 20, wherein the memory control circuit unit is further configured to receive fourth data before the second data is received,
wherein the memory control circuit unit is further configured to instruct to store temporarily the fourth data in the buffer area,
wherein the memory control circuit unit is further configured to transmit a third write command sequence to program the fourth data into a second lower physical programming unit among the lower physical programming units,
wherein the memory control circuit unit is further configured to receive fifth data after the second data is received,
wherein the memory control circuit unit is further configured to instruct to store temporarily the fifth data in the buffer area,
wherein the memory control circuit unit is further configured to instruct to perform a second data obtaining operation corresponding to the second lower physical programming unit, wherein the second data obtaining operation comprises reading the fourth data from the buffer area,
wherein the memory control circuit unit is further configured to transmit a fourth write command sequence to program the fifth data into a second upper physical programming unit among the upper physical programming units according to the fourth data obtained by the second data obtaining operation, wherein the second upper physical programming unit is corresponding to the second lower physical programming unit,
wherein the operation of programming the fourth data into the second lower physical programming unit is performed between the operation of programming the first data into the first lower physical programming unit and the operation of programming the second data into the first upper physical programming unit.

22. The memory storage device according to claim 18, wherein the first upper physical programming unit and the first lower physical programming unit belong to a same word line.

23. A memory control circuit unit, for controlling a rewritable non-volatile memory module, wherein the rewritable non-volatile memory module comprises a plurality of physical erasing units, wherein a first physical erasing unit among the physical erasing units comprises a plurality of lower physical programming units and a plurality of upper physical programming units corresponding to the lower physical programming units, the memory control circuit unit comprising:
 a host interface, configured to couple to a host system;
 a memory interface, configured to couple to the rewritable non-volatile memory module; and
 a memory management circuit, coupled to the host interface and the memory interface,
 wherein the memory management circuit is configured to receive first data and transmit a first write command sequence to program the first data into a first lower physical programming unit among the lower physical programming units,
 wherein the memory management circuit is further configured to instruct to temporarily store the first data in a buffer area of the rewritable non-volatile memory module,
 wherein the memory management circuit is further configured to receive second data,
 wherein the memory management circuit is further configured to instruct to perform a first data obtaining operation corresponding to the first lower physical programming unit to obtain third data, wherein the first data obtaining operation comprises reading the first data from the buffer area,
 wherein the memory management circuit is further configured to transmit a second write command sequence to program the second data into a first upper physical programming unit among the upper physical programming units according to the third data.

24. The memory control circuit unit according to claim 23, wherein the memory management circuit is further configured to maintain continuously the first data temporarily stored in the buffer area until the first data obtaining operation is completed or no failure occurs during programming the second data into the first upper physical programming unit.

25. The memory control circuit unit according to claim 23, wherein a size of the buffer area is not less than a default size, wherein the default size is triple a size of one physical programming unit in the rewritable non-volatile memory module.

26. The memory control circuit unit according to claim 25, wherein the memory management circuit is further configured to receive fourth data before the second data is received,
 wherein the memory management circuit is further configured to instruct to store temporarily the fourth data in the buffer area,
 wherein the memory management circuit is further configured to transmit a third write command sequence to program the fourth data into a second lower physical programming unit among the lower physical programming units,
 wherein the memory management circuit is further configured to receive fifth data after the second data is received,
 wherein the memory management circuit is further configured to instruct to store temporarily the fifth data in the buffer area,
 wherein the memory management circuit is further configured to instruct to perform a second data obtaining operation corresponding to the second lower physical programming unit, wherein the second data obtaining operation comprises reading the fourth data from the buffer area,
 wherein the memory management circuit is further configured to transmit a fourth write command sequence to program the fifth data into a second upper physical programming unit among the upper physical programming units according to the fourth data obtained by the second data obtaining operation, wherein the second upper physical programming unit is corresponding to the second lower physical programming unit,
 wherein the operation of programming the fourth data into the second lower physical programming unit is performed between the operation of programming the first data into the first lower physical programming unit and the operation of programming the second data into the first upper physical programming unit.

27. The memory control circuit unit according to claim 23, wherein the first upper physical programming unit and the first lower physical programming unit belong to a same word line.

* * * * *